(12) United States Patent
Yedidia et al.

(10) Patent No.: US 7,103,818 B2
(45) Date of Patent: Sep. 5, 2006

(54) TRANSFORMING GENERALIZED PARITY CHECK MATRICES FOR ERROR-CORRECTING CODES

(75) Inventors: Jonathan S. Yedidia, Cambridge, MA (US); Jinghu Chen, Honolulu, HI (US)

(73) Assignee: Mitsubishi Electric Research Laboratories, Inc, Cambridge, MA (US)

( * ) Notice: Subject to any disclaimer, the term of this patent is extended or adjusted under 35 U.S.C. 154(b) by 470 days.

(21) Appl. No.: 10/260,334

(22) Filed: Sep. 30, 2002

(65) Prior Publication Data

US 2004/0064776 A1  Apr. 1, 2004

(51) Int. Cl.
H03M 13/00 (2006.01)
(52) U.S. Cl. .................. 714/752; 714/801; 714/804
(58) Field of Classification Search .............. 714/752, 714/755, 801, 804, 767
See application file for complete search history.

(56) References Cited

U.S. PATENT DOCUMENTS 4,862,463 A * 8/1989 Chen .................... 714/767
5,425,038 A * 6/1995 Chen .................... 714/755

OTHER PUBLICATIONS

MacKay, "Relationships between sparse graph codes," Proceedings IBIS 200, Japan, 2000.
Jin et al., "Irregular repeat-accumulation codes," Second international conference on turbo codes, Brest, France, 2000.
Lucas et al., "Iterative decoding of one-step majority logic decodable codes based on belief propagation," IEEE Transactions on communications, vol. 48, No. 6, Jun. 2000.

* cited by examiner

Primary Examiner—Guy J. Lamarre
(74) Attorney, Agent, or Firm—Dirk Brinkman; Andrew J. Curtin

(57) ABSTRACT

A method transforms a generalized parity check matrix representing a linear block binary code. First, an input generalized parity check matrix is defined for the linear block binary code. Auxiliary sets are formed from the input generalized parity check matrix and organized into a partially ordered set. The subsets of each auxiliary set are ordered in a list, and parity check equations are constructed from the list of ordered subsets. The parity check equations are translated into an output generalized parity check matrix, which can be used to decode a message encoded according to the linear block binary code.

14 Claims, 4 Drawing Sheets $$x_{\{1,2,3,5\}} = x_{\{2,3\}} \oplus x_1 \oplus x_5 = 0$$
$$x_{\{1,2,3,5\}} = x_{\{3,5\}} \oplus x_1 \oplus x_2 = 0$$
$$x_{\{2,3,4,6\}} = x_{\{2,3\}} \oplus x_4 \oplus x_6 = 0$$
$$x_{\{2,3,4,6\}} = x_{\{3,4\}} \oplus x_2 \oplus x_6 = 0$$
$$x_{\{3,4,5,7\}} = x_{\{3,4\}} \oplus x_5 \oplus x_7 = 0$$
$$x_{\{3,4,5,7\}} = x_{\{3,5\}} \oplus x_4 \oplus x_7 = 0$$
$$x_{\{2,3\}} = x_2 \oplus x_3$$
$$x_{\{3,4\}} = x_3 \oplus x_4$$
$$x_{\{3,5\}} = x_3 \oplus x_5$$

FIG. 4

TRANSFORMING GENERALIZED PARITY CHECK MATRICES FOR ERROR-CORRECTING CODES

FIELD OF THE INVENTION

The present invention relates generally to the field of error-correcting codes for data storage and data transmission, and more particularly to obtaining generalized parity check matrices for decoding methods.

BACKGROUND OF THE INVENTION

A fundamental problem in the field of data storage and communication is the development of practical decoding methods for error-correcting codes (ECC), see Lin et al., "*Error Control Coding: Fundamentals and Applications*," Prentice Hall: Englewood Cliffs, N.J., 1983, Peterson et al., "*Error-Correcting Codes*," 2nd edition, MIT Press: Cambridge, Mass., 1972, and MacWilliams et al., "*The Theory of Error-Correcting Codes*," North-Holland: New York, N.Y., 1977.

An important class of such decoding methods include the prior art iterative decoding methods exemplified by the a posteriori probability propagation (APP) decoding method, and the belief propagation (BP) decoding method, which is also known as the "sum-product" decoding method. A large variety of other related decoded methods are based on simplifications or other alterations of the APP or BP decoding methods. A collection of papers on these decoding methods is contained in the "*Special Issue on Codes on Graphs and Iterative Algorithms*," IEEE Transactions on Information Theory, 47(2), February 2001.

These decoding methods use a representation of the code, which is specified by a generalized parity check (GPC) matrix, see Mackay, "*Relationships between Sparse Graph Codes*," Proceedings of IBIS 2000. The decoding performance of these methods normally depends on the GPC matrix used to represent the code.

Basic Definitions for Binary Linear Block Error-Correcting Codes

Any references to "codes" herein specifically mean binary linear block error-correcting codes. The basic idea behind these codes is to encode messages of k bits using blocks of N bits, where N>k. The additional N−k bits are used to decode corrupted messages. Corruption can be caused by failure in the storage media or noise in the transmission channel.

A code C is defined by set of $2^k$ possible blocks of code words having a bit length N. A code with parameters N and k is often referred to as an (N, k) code. Codes are normally much more effective when N and k are large. However, as the size of the parameters N and k increase, so does the difficulty of decoding corrupted messages.

Generalized Parity Check GPC Matrices

A binary block code is "linear" if the modulo 2 sum of any two code-words also is a code-word. For example, the modulo 2 sum of 1110100 and 0111010 is 1001110. When a binary block code is linear, the modulo 2 sum of any two code-words form another code-word. Linear codes can be represented by a generalized parity check (GPC) matrix. In fact, a linear code may be represented by many different GPC matrices.

The GPC matrix representing an (n, k) code is defined by a matrix of 1's and 0's, with M rows and N columns, where $N \geq n$. The columns of the GPC matrix are arranged so that the first n columns correspond to the n bits of the code. The remaining N−n columns correspond to "state variable bits" that help define the code. These state variable bits are sometimes referred to as "hidden bits" or "auxiliary bits." The value of n must be specified along with the N by M matrix to fully specify a code using the GPC matrix.

Each row of the GPC matrix represents a parity check constraint. The bits involved in the constraint represented by a particular row correspond to the columns that have a 1 in that row. The parity check constraint enforces that the sum of the bits must be even, or equivalently 0 when summed modulo 2. For example, a GPC matrix with N=7

$$\begin{bmatrix} 1 & 1 & 1 & 0 & 1 & 0 & 0 \\ 0 & 1 & 1 & 1 & 0 & 1 & 0 \\ 0 & 0 & 1 & 1 & 1 & 0 & 1 \end{bmatrix} \quad (1)$$

represents three constraints $$x_1 \oplus x_2 \oplus x_3 \oplus x_5 = 0 \quad (2)$$

$$x_2 \oplus x_3 \oplus x_4 \oplus x_6 = 0 \quad (3)$$

$$x_3 \oplus x_4 \oplus x_5 \oplus x_7 = 0, \quad (4)$$

where the variable $x_i$ represents the value of the ith bit, which can be 0 or 1, and the symbol $\oplus$ represents the modulo 2 sum. This GPC matrix is one way to represent the well-known Hamming (7, 4) code. This code is used an example code transformed below according to the invention.

Some of the M different constraints represented by the GPC matrix may be linearly dependent. In the GPC matrices given in equations (1) and (5), all the constraints are linearly independent. Another representation for the same code is a GPC matrix with N=n=7

$$\begin{bmatrix} 1 & 1 & 1 & 0 & 1 & 0 & 0 \\ 0 & 1 & 1 & 1 & 0 & 1 & 0 \\ 0 & 0 & 1 & 1 & 1 & 0 & 1 \\ 1 & 0 & 0 & 1 & 1 & 1 & 0 \\ 0 & 1 & 0 & 0 & 1 & 1 & 1 \\ 1 & 0 & 1 & 0 & 0 & 1 & 1 \\ 1 & 1 & 0 & 1 & 0 & 0 & 1 \end{bmatrix}. \quad (5)$$

In this GPC matrix, the last four rows can be obtained by adding together combinations of the first three rows. This implies that the last four rows are merely redundant constraints, and there are actually only three linearly independent rows. For example, the fourth row can be obtained by adding together the first two rows. For this GPC matrix, there are three linearly independent rows. In general, there will be N−k linearly independent rows in an M by N GPC matrix representation of an (n, k) code.

The GPC matrices given in equations (1) and (5) did not use any hidden bits. Another GPC matrix that uses hidden bits and represents the same code is the GPC matrix, with N=11 and n=7, $$\begin{bmatrix} 1 & 0 & 0 & 0 & 0 & 0 & 1 & 0 & 0 & 0 \\ 0 & 1 & 0 & 0 & 0 & 0 & 0 & 1 & 0 & 0 \\ 0 & 0 & 1 & 0 & 0 & 0 & 1 & 0 & 1 & 0 \\ 0 & 0 & 0 & 1 & 0 & 0 & 1 & 1 & 0 & 1 \\ 0 & 0 & 0 & 0 & 1 & 0 & 0 & 1 & 1 & 0 \\ 0 & 0 & 0 & 0 & 0 & 1 & 0 & 0 & 1 & 1 \\ 0 & 0 & 0 & 0 & 0 & 0 & 1 & 0 & 0 & 1 \end{bmatrix}. \quad (6)$$

Decoding Methods Based on GPC Matrices

As stated above, prior-art decoding methods that utilize a representation of a code by a GPC matrix include the a posteriori probability propagation (APP) decoding method, belief propagation (BP), and the "sum-product" decoding method. If the same code is represented using two different GPC matrices, then the performance of these decoding methods is also different.

Often, the performance of decoding methods is measured in comparison with an optimal decoder that uses a maximum likelihood (ML) method. The ML decoder scans through all $2^k$ possible code-words, and selects the one that is most likely to have been transmitted. However, the ML decoding method is not practical when k is large.

Generally speaking, the BP decoding method performs somewhat better than the APP decoding method, but at a cost in computational complexity. Other decoding methods based on these methods typically involve a similar trade-off between performance and complexity, but as a class, these decoding methods are considered to be practical for codes with large N and k.

Generally, the iterative decoding methods based on or similar to the BP and APP decoding methods perform reasonably close to ML decoding with GPC matrices that satisfy the following constraints: the number of 1's in each row is small; the number of rows is large; and the number of columns that have a 1 in both rows is small, i.e., ideally zero or one, for any two rows in the matrix.

Many codes, e.g., low-density parity check (LDPC) codes, first described by Gallager, in "*Low-density parity check codes*," Vol.21, Research Monograph Series, MIT Press, 1963 or irregular repeat-accumulate (IRA) codes, described by Khandkar et al., in "*Irregular Repeat-Accumulate Codes*," 2nd International Symposium on Turbo codes and Related Topics, pp. 1–8, 2000, are designed so that their GPC matrices have these characteristics, insofar as possible. The BP and APP decoding methods work quite well for these codes.

Some codes, e.g., one-step majority logic decodable codes, were designed to use other criteria, but have GPC matrix representations appropriate for BP or APP decoding. The performance of the BP and APP decoding methods is also good for these codes, see Lucas et al., "*Iterative Decoding of One-Step Majority Logic Decodable Codes Based on Belief Propagation*," IEEE Transactions on Communications, vol. COM-48, pp. 931–937, 2000.

Other classical codes such as Bose, Chaudhuri, and Hocquenghen (BCH) codes, and codes based on Euclidean or projective geometries also work well with ML decoding and have known GPC matrix representations. However, the known GPC matrix representations for these classical codes do not satisfy the three constraints above, and therefore iterative decoding methods perform poorly.

Therefore, there is a need for a method to transform a GPC matrix representation of a code into another GPC matrix representation of the same code. More particularly, it is desired to transform a GPC matrix representation so that the transformed GPC matrix works better than the original matrix when used with iterative decoding methods.

SUMMARY OF THE INVENTION

The present invention provides a method for transforming an input generalized parity check (GPC) matrix representing a linear block binary code into an output GPC matrix representing the identical code. It is an object of the invention that the transformed GPC matrix performs better with certain decoding methods, for example coding methods based on a posteriori probability propagation (APP) decoding or belief propagation (BP) decoding.

The input GPC matrix has M rows and N columns where all entries are 1's or 0's. The columns represent transmitted or state variable bits in the code, and the rows represent parity check constraints between the bits.

The transformation method first forms three different "auxiliary sets" of bits, from the input GPC matrix. The auxiliary sets includes "constraint," "intersection," and "single bit" sets. The constraint sets of bits are constrained to obey a parity check in the input GPC matrix. The intersection sets are formed from the intersections of pairs of the constraint sets. The single bit sets are formed from single bits of the input GPC matrix.

A second step of the transformation organizes the auxiliary sets, and lists for each set of bits, all the subsets of that set.

In a third step of the transformation method, parity check equations are constructed for the output GPC matrix.

In a fourth step, some of the parity check equations obtained can be discarded as long as there remains at least one parity check equation for each set of bits.

Finally, in a fifth step of the transformation method, the remaining parity check equations are translated into the output GPC matrix, which can then be used to decode messages with a better performance than is possible with the input GPC matrix.

BRIEF DESCRIPTION OF THE DRAWING

FIG. 4 is a list of parity check equations.

DETAILED DESCRIPTION OF THE PREFERRED EMBODIMENT

Figure 1:
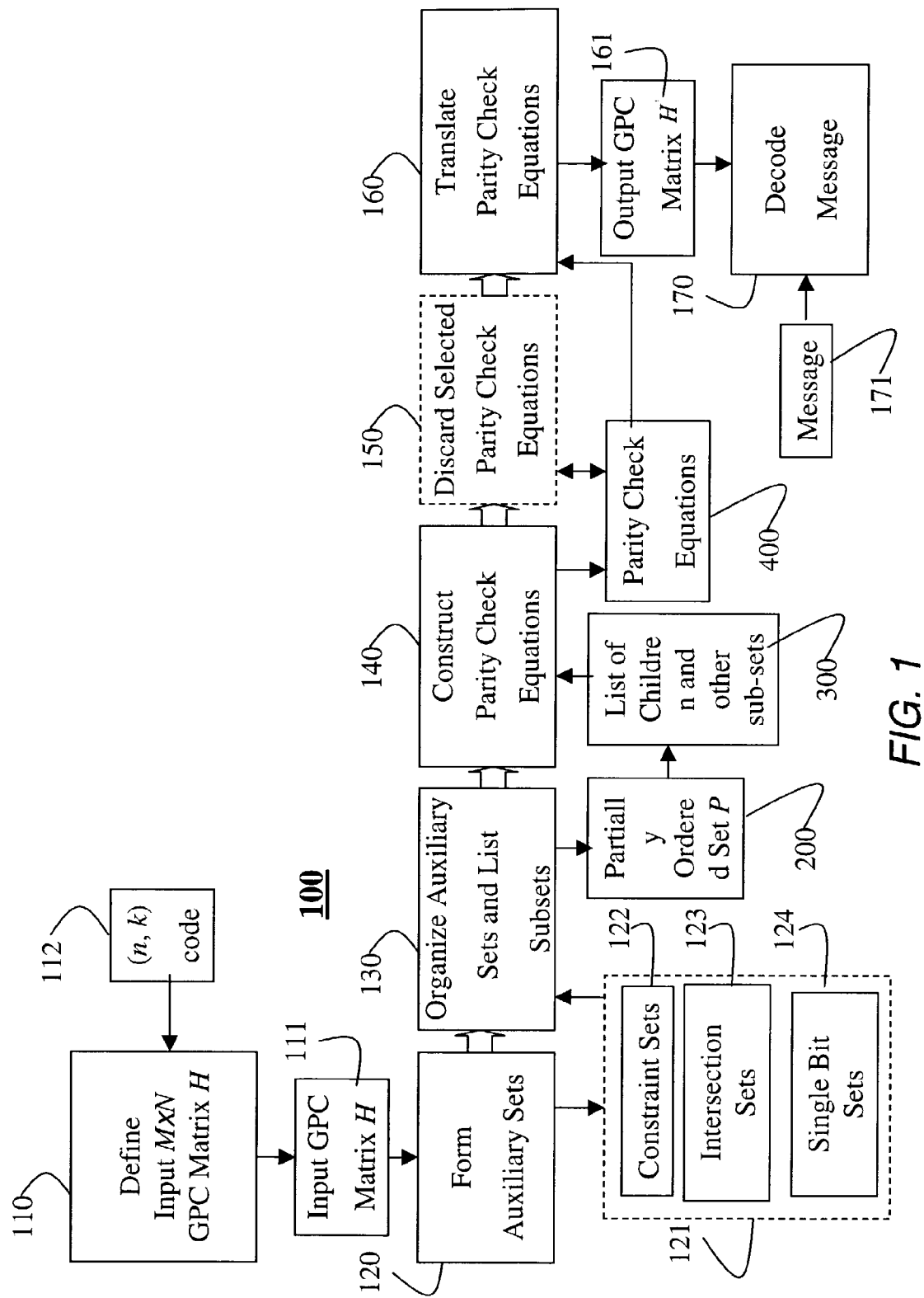
FIG. 1 is a flow diagram of the method according to the invention.

FIG. 1 shows the steps of a method 100 for transforming a generalized parity check matrix for error-correcting codes (ECC) according to our invention. In our method 100, we first define 110 an input M×N GPC matrix H 111 representing an (n, k) code 112. The transformation 100 generates an output M'×N' GPC matrix H' 161 representing the identical code 112. The value N' is greater than the value N because we retain all the variables used in the original representation, and add state variable bits. The output matrix 161 can be used to decode 170 a message 171 with better a better performance than would be obtained if the original input matrix 111 was used.

Step 120 of our method forms three different auxiliary sets S 121 of bits that represent the overall parity of sets of the N bits corresponding to columns of the input GPC matrix 111. We index the N bits by integers from 1 to N. We denote the value of the ith bit by $x_i$, where $x_i$ can take on the values 0 or 1. For any auxiliary set 121 of bits S, we use the notation $x_s$ to denote the modulo two sum of the bits in the auxiliary set S. For example, if $x_1=1$, $x_2=0$, and $x_3=1$, then $$x_{\{1,2,3\}} = 1 \oplus 0 \oplus 1 = 0. \tag{7}$$

Clearly $x_s=0$ means that the sum of the bits in the set S, which we refer to as the parity of the set S, is even, while $x_s=1$ means that the parity of the set S is odd.

All of the state variable bits that we form are derived from sets of the original N bits in the input matrix 111. In fact, we use three different kinds of auxiliary sets of bits in our method. We call these different sets "constraint sets" 122, "intersection sets" 123, and "single bit" sets 124. We illustrate the procedure for forming these different auxiliary sets using the GPC matrix $$H = \begin{bmatrix} 1 & 1 & 1 & 0 & 1 & 0 & 0 \\ 0 & 1 & 1 & 1 & 0 & 1 & 0 \\ 0 & 0 & 1 & 1 & 1 & 0 & 1 \end{bmatrix}, \tag{8}$$

which we previously introduced and which represents the Hamming (7, 4) code.

Constraint Sets

The constraint auxiliary sets 122 are formed as follows. For each row in the input matrix H 111, we take the sets of bits that are 1 in that row. In our example, we obtain the sets $\{1,2,3,5\}$ from the first row, $\{2,3,4,6\}$ from the second row, and $\{3,4,5,7\}$ from the third row. By the definition of the GPC matrix, we know that $x_s=0$ for every constraint set S 122.

Intersection Sets

We form the intersection auxiliary sets 123 from pairs of the constraint sets 122. In our example, we obtain the intersection set $\{2,3\}$ from the intersection of $\{1,2,3,5\}$ and $\{2,3,4,6\}$, the set $\{3,5\}$ from the intersection of $\{1,2,3,5\}$ and $\{3,4,5,7\}$, and the set $\{3,4\}$ from the intersection of $\{2,3,4,6\}$ and $\{3,4,5,7\}$. We discard any intersection sets that contain less than two bits. Where possible, we obtain new intersection sets by forming intersections of pairs previously formed intersection sets, discarding any sets that were previously obtained or contain less than two bits. We continue to form intersection sets using intersections of previously obtained intersection sets until no new intersection sets can be obtained.

Some of the intersection sets 123 can be discarded at this stage. It may be desirable to discard some of the intersection sets to ensure that the output GPC matrix 161 is a manageable size. The remaining intersection sets ultimately correspond to the new state variable bits that are used in the output GPC matrix H' 161.

Single Bit Sets

We obtain the single bit auxiliary sets 124 by forming all possible sets containing just a single bit of the N bits in the input GPC matrix H 111. In our example, we obtain the single bit sets $\{1\}$, $\{2\}$, $\{3\}$, $\{4\}$, $\{5\}$, $\{6\}$, and $\{7\}$.

Organizing and List the Sets

Figure 2:
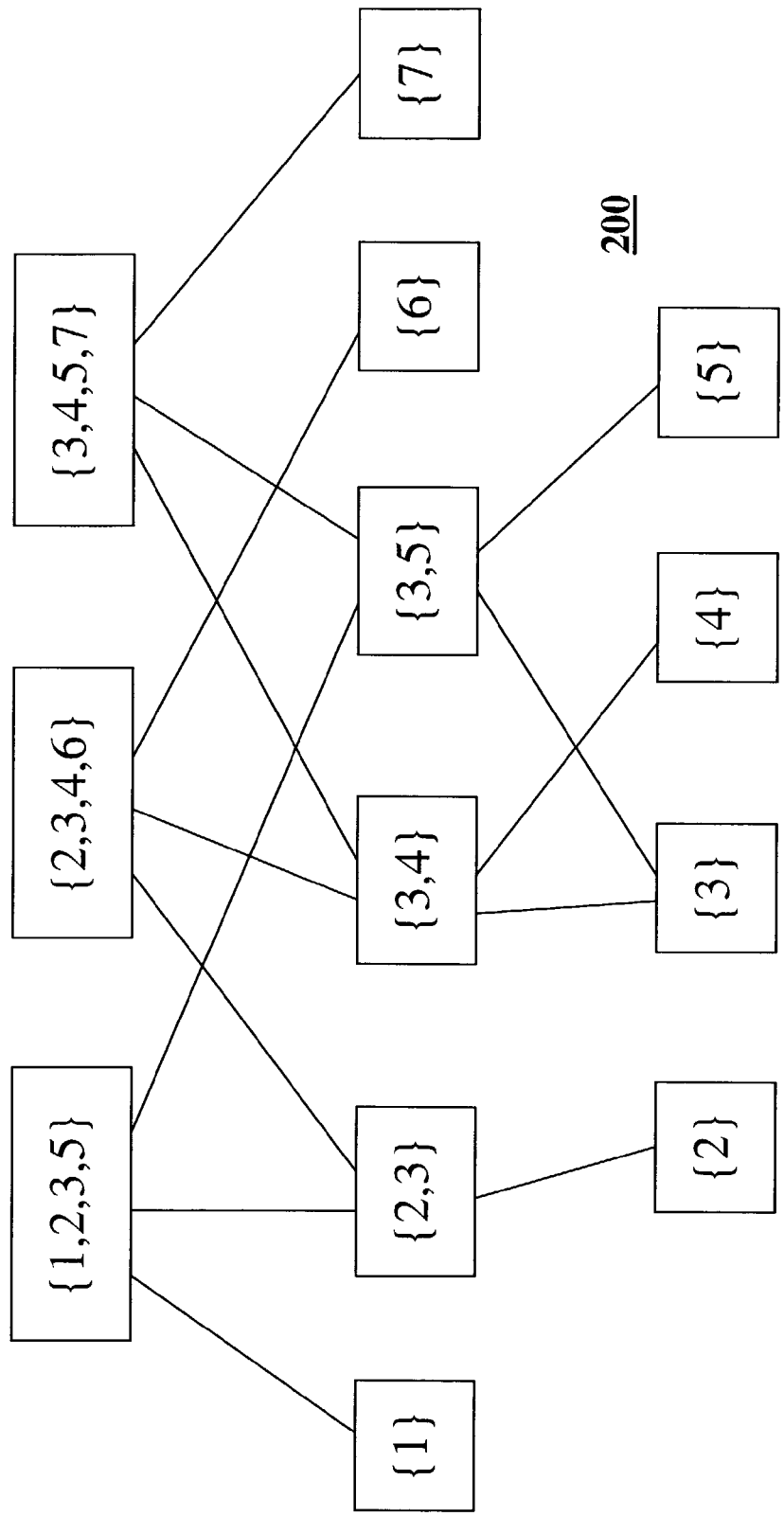
FIG. 2 is a diagram of a partially ordered set of auxiliary sets.

In step 130, we organize the constraint sets 122, the intersection sets 123, and the single bit sets 124 into a partially ordered set of auxiliary sets P 200, as shown in FIG. 2. In FIG. 2, auxiliary sets that are connected are related by a parent-child relationship, with parents drawn above children. When an auxiliary set of bits S in P is a subset of another auxiliary set of bits T in P, we write S<T. If S<T and there is no other set U in P such that S<U<T, then we say that S is a "child" of T and T is a "parent" of S. In our example, the set $\{1,2,3,5\}$ is a parent of the set $\{2,3\}$ and of the set $\{1\}$, but it is not a parent of the set $\{2\}$, because $\{2\}<\{2,3\}<\{1,2,3,5\}$. The subset relationship induces a partial ordering on the elements of P. For background on partially ordered sets, see R. P. Stanley, "*Enumerative Combinatorics, Vol. 1,*" Cambridge University Press, 1986.

Figure 3:
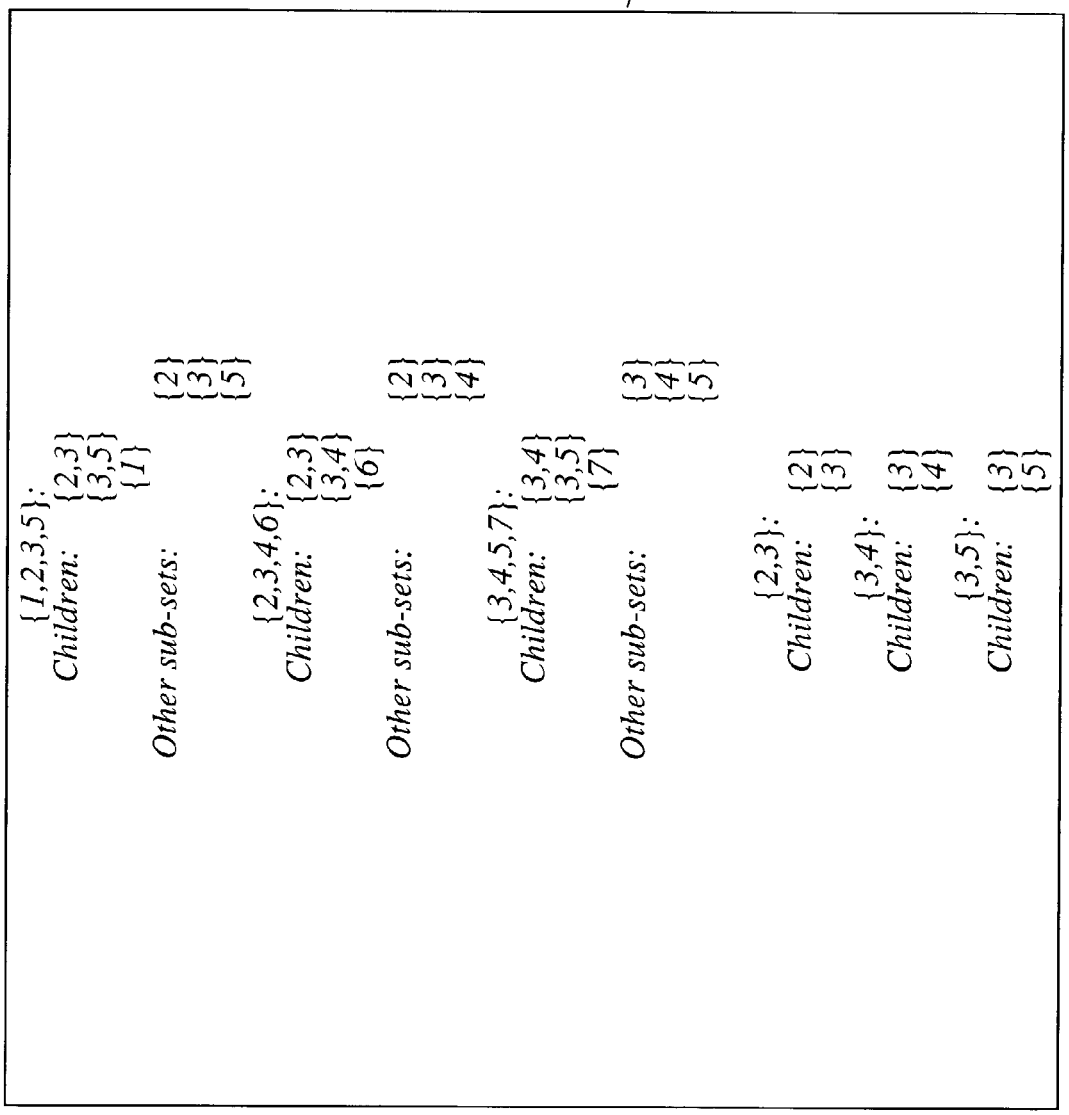
FIG. 3 is an organized listing of subsets of auxiliary sets.

For each of the constraint and intersection sets, we list of all the subsets of that set. In the preferred embodiment of the method, the list is organized with children listed before other subsets. In the preferred embodiment of the method, among the children sets and other subsets, we list the larger sets first. In our example, we obtain the lists 300 shown in FIG. 3.

Constructing Parity Check Equations for the Output GPC Matrix

In step 140, we construct at least one parity check equation for each constraint set and intersection set of bits using the ordered list 300. The step is similar for these two sets; the only difference is that for a constraint set S, we know that $x_s=0$, and we exploit that.

For each constraint set and intersection set, we find one or more collections of non-overlapping subsets that include every bit in the set. In the preferred embodiment of our method, we do this using the following procedure. Start with the first child on the list 200 of subsets for the set, e.g., for the set $\{1,2,3,5\}$, the first child would be $\{2,3\}$). Remove those bits from the set, e.g., we are left with bits 1 and 5. Next, we try to find the first subset on the list that contains a subset of the remaining bits, e.g., the subset 1. Again remove those bits from the set, and repeat until all the bits are accounted for in non-overlapping subsets. In our example, we obtain $\{1,2,3,5\}=\{2,3\}\cup\{1\}\cup\{5\}$. From this equation, we obtain the corresponding parity check equation $x_{\{1,2,3,5\}}=x_{\{2,3\}}\oplus x_1 \oplus x_5=0$.

In the preferred embodiment of our method, we attempt to find additional, redundant parity checks for each set by going on to the next child in the list that was not already involved in one of the preceding parity checks, and repeating the above procedure. In our example, we obtain $\{1,2,3,5\}=\{3,5\}\cup\{1\}\cup\{2\}$ and $x_{\{1,2,3,5\}}=x_{\{3,5\}}\oplus x_1 \oplus x_2=0$. We continue until every child is involved in one or more parity checks. FIG. 4 shows the parity check equations 400 constructed for our example output matrix.

Note that because all variables are equal to their negatives under modulo 2 arithmetic, we can rearrange the equations derived using the intersection sets to a standard form that has a sum of parities on the left-hand side of the equation and zero on the right-hand side. In our example, we obtain $$x_{\{2,3\}} \oplus x_2 \oplus x_3 = 0 \tag{9}$$

$$x_{\{3,4\}} \oplus x_3 \oplus x_4 = 0 \tag{10}$$

$$x_{\{3,5\}} \oplus x_3 \oplus x_5 = 0. \tag{11}$$

Discarding Parity-Check Equations

In an optional step 150 of our method, selected parity check equations can be discarded. However, to ensure that the output GPC matrix 161 corresponds to the same code as the input GPC matrix 111, it is essential that there be at least one equation corresponding to each constraint set and each intersection set. Thus, in our example, we can discard one of the equations derived using the $\{1,2,3,5\}$ set, but not both of them.

It may be desirable to discard some of the parity check equations to ensure that all pairs of parity check equations never involve two or more of the same variables.

This ensures that no two rows of the output GPC matrix 161 have 1's in more than one of the same columns, which we previously listed as a desirable property of GPC matrices when used for decoding algorithms based on or similar to APP or BP decoding.

Transforming the Parity Check Equations to the Output GPC Matrix

Next, the remaining parity check equations 400 are translated 160 into the output GPC matrix 161 H'. Each parity check equation corresponds to a row of the output GPC matrix. In our example, assuming that we did not discard any of the parity check equations in the previous step 150, we obtain the output GPC matrix 161 for the (7,4) Hamming code $$H' = \begin{bmatrix} 1&2&3&4&5&6&7&23&34&35 \\ 1 & 0 & 0 & 0 & 1 & 0 & 0 & 1 & 0 & 0 \\ 1 & 1 & 0 & 0 & 0 & 0 & 0 & 0 & 0 & 1 \\ 0 & 0 & 0 & 1 & 0 & 1 & 0 & 1 & 0 & 0 \\ 0 & 1 & 0 & 0 & 0 & 1 & 0 & 0 & 1 & 0 \\ 0 & 0 & 0 & 0 & 1 & 0 & 1 & 0 & 1 & 0 \\ 0 & 0 & 0 & 1 & 0 & 0 & 1 & 0 & 0 & 1 \\ 0 & 1 & 1 & 0 & 0 & 0 & 0 & 1 & 0 & 0 \\ 0 & 0 & 1 & 1 & 0 & 0 & 0 & 0 & 1 & 0 \\ 0 & 0 & 1 & 0 & 1 & 0 & 0 & 0 & 0 & 1 \end{bmatrix}. \quad (12)$$

Above each column, we indicate the bit or set of bits from corresponding column in the input GPC matrix.

In step 170, the output GPC matrix 161 can be used to decode a message 171.

Effect of the Invention

The output GPC matrix H 161 always represents the identical code as the input GPC matrix H 111. In addition, it can have better decoding performance for the message 171, using for example APP or BP decoding methods, than the input matrix. In our example, each row of the output matrix has only three 1's, whereas the input GPC matrix has four 1's in each row. In the output matrix G', no two rows have a 1 in two or more of the same columns, while for the input GPC matrix, all pairs of rows have 1's in two of the same columns.

Notice also that the output GPC matrix has more state variable bits than the input GPC matrix, and that the output GPC matrix normally uses more redundant checks than the input GPC matrix.

Experiments demonstrate that the belief propagation decoding method can perform significantly better when using GPC matrices transformed according to the invention. For example, consider the Golay (n=23, k=12) code. It is possible to show, using standard theory found in e.g. Lin et al., "*Error Control Coding: Fundamentals and Applications,*" Prentice Hall: Englewood Cliffs, N.J., 1983, that this code can be represented by the parity check matrix $$H_{Golay} = \begin{pmatrix} 1&1&1&1&1&0&0&0&0&0&0&0&0&0&1&0&1&0&0&1&0&0 \\ 0&1&1&1&1&1&0&0&0&0&0&0&0&0&0&1&0&1&0&0&1&0 \\ 0&0&1&1&1&1&1&0&0&0&0&0&0&0&0&0&1&0&1&0&0&1 \\ 1&0&0&1&1&1&1&1&0&0&0&0&0&0&0&0&0&1&0&1&0&0 \\ 0&1&0&0&1&1&1&1&1&0&0&0&0&0&0&0&0&0&1&0&1&0 \\ 0&0&1&0&0&1&1&1&1&1&0&0&0&0&0&0&0&0&0&1&0&1 \\ 1&0&0&1&0&0&1&1&1&1&1&0&0&0&0&0&0&0&0&0&1&0 \\ 0&1&0&0&1&0&0&1&1&1&1&1&0&0&0&0&0&0&0&0&0&1 \\ 1&0&1&0&0&1&0&0&1&1&1&1&1&0&0&0&0&0&0&0&0&0 \\ 0&1&0&1&0&0&1&0&0&1&1&1&1&1&0&0&0&0&0&0&0&0 \\ 0&0&1&0&1&0&0&1&0&0&1&1&1&1&1&0&0&0&0&0&0&0 \\ 0&0&0&1&0&1&0&0&1&0&0&1&1&1&1&1&0&0&0&0&0&0 \\ 0&0&0&0&1&0&1&0&0&1&0&0&1&1&1&1&1&0&0&0&0&0 \\ 0&0&0&0&0&1&0&1&0&0&1&0&0&1&1&1&1&1&0&0&0&0 \\ 0&0&0&0&0&0&1&0&1&0&0&1&0&0&1&1&1&1&1&0&0&0 \\ 0&0&0&0&0&0&0&1&0&1&0&0&1&0&0&1&1&1&1&1&0&0 \\ 0&0&0&0&0&0&0&0&1&0&1&0&0&1&0&0&1&1&1&1&1&0 \\ 0&0&0&0&0&0&0&0&0&1&0&1&0&0&1&0&0&1&1&1&1&1 \\ 1&0&0&0&0&0&0&0&0&0&1&0&1&0&0&1&0&0&1&1&1&1 \\ 1&1&0&0&0&0&0&0&0&0&0&1&0&1&0&0&1&0&0&1&1&1 \\ 1&1&1&0&0&0&0&0&0&0&0&0&1&0&1&0&0&1&0&0&1&1 \\ 1&1&1&1&0&0&0&0&0&0&0&0&0&1&0&1&0&0&1&0&0&1 \end{pmatrix} \quad (13)$$

$H_{Golay}$ has 23 rows and 23 columns. Notice that $H_{Golay}$ does not have all the characteristics one would like for use with an iterative decoding method like BP or APP. In particular, many pairs of rows have ones in several of the same columns.

If we use $H_{Golay}$ as an input GPC matrix for our method, without discarding any intersection sets or parity check equations, we obtain an output GPC matrix $H'_{Golay}$ that has 495 rows and 230 columns.

We implemented the standard BP decoding method using both $H_{Golay}$ and $H'_{Golay}$, and assumed that the channel was the binary erasure channel. In the binary erasure channel, each bit is erased with probability $p_e$, and received correctly with probability $1-p_e$. For an erasure probability of $p_e=0.16$, the BP decoding method using $H_{Golay}$ fails to decode approximately 0.49% of the received blocks, while the decoding method using $H'_{Golay}$ only fails to decode approximately 0.087% of the received blocks. Other erasure probabilities gave similar improvements.

Because the Golay code has small values of n and k, and also because the binary erasure channel is particularly simple, we can compare these results with the performance of optimal maximum likelihood decoding. We find that the performance of BP decoding using $H'_{Golay}$ is nearly indistinguishable from optimal ML decoding. In particular, of 230,000 randomly generated blocks using an erasure probability of $p_e=0.16$, BP decoding using $H'_{Golay}$ failed to decode 200 blocks, but those were precisely the same blocks that maximum likelihood decoding also failed to decode.

Experiments on other, larger codes also show that the decoding performance of the BP decoding method can be improved using GPC matrices transformed according to our method.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

We claim:

1. A computer implemented method for transforming a generalized parity check matrix representing a linear block binary code, comprising the steps of:
   defining an input generalized parity check matrix for the linear block binary code;
   forming auxiliary sets from the input generalized parity check matrix;
   ordering subsets of each auxiliary set in a list;
   constructing parity check equations from the list of ordered subsets;
   translating the parity check equations into an output generalized parity check matrix; and
   decoding a message encoded according to the linear block binary code with the output generalized parity check matrix.

2. The method of claim 1 wherein the input generalized parity check matrix has M×N rows and columns and represents an (n, k) linear block binary code, and the output generalized parity check matrix has M'×N' rows and columns, where N' is greater than N.

3. The method of claim 1 wherein the auxiliary sets include constraint sets, intersection sets, and single bit sets.

4. The method of claim 3 further comprising:
   taking, for each row in the input generalized parity check matrix, a set of bits that are 1 in that row to form each constraint set.

5. The method of claim 3 further comprising:
   forming the intersection sets from pairs of the constraint sets.

6. The method of claim 5 further comprising:
   forming intersections from pairs of previously formed intersection sets.

7. The method of claim 3 further comprising:
   discarding any intersection sets that contain less than two bits.

8. The method of claim 3 further comprising:
   forming the single bit sets from all possible sets of single bits of the input generalized parity check matrix.

9. The method of claim 1 wherein the ordering of subsets of each auxiliary set begins with children of the auxiliary subset, and then other subsets.

10. The method of claim 1 wherein the ordering of the children and other subsets goes from large subsets to small subsets.

11. The method of claim 1 further comprising:
    finding one or more collections of non-overlapping subsets that include every bit in a particular auxiliary set to construct a corresponding parity check equation.

12. The method of claim 1 wherein each parity check equation corresponds to a row of the output GPC matrix.

13. The method of claim 1 further comprising:
    discarding selected parity check equations.

14. A computer program product storing a computer program which when executed by a computer performs a method for transforming a generalized parity check matrix representing a linear block binary code by performing the steps of:
    defining an input generalized parity check matrix for the linear block binary code;
    forming auxiliary sets from the input generalized parity check matrix;
    ordering subsets of each auxiliary set in a list;
    constructing parity check equations from the list of ordered subsets;
    translating the parity check equations into an output generalized parity check matrix; and
    decoding a message encoded according to the linear block binary code with the output generalized parity check matrix.

* * * * *